USE OF HALOGENS AND HYDROGEN HALIDES IN INSULATING OXIDE AND NITRIDE DEPOSITS

Original Filed April 27, 1964

INVENTORS
Ting Li Chu and
Harold F. John
BY Gordon H Telfer
ATTORNEY

United States Patent Office 3,373,051
Patented Mar. 12, 1968

3,373,051

USE OF HALOGENS AND HYDROGEN HALIDES IN INSULATING OXIDE AND NITRIDE DEPOSITS

Ting L. Chu, Forest Hills, Pittsburgh, and Harold F. John, Wilkingsburg, Pa., assignors to Westinghouse Electric Corporation, Pittsburgh, Pa., a corporation of Pennsylvania Original application Apr. 27, 1964, Ser. No. 362,733. Divided and this application Mar. 16, 1967, Ser. No. 623,699
9 Claims. (Cl. 117—106)

ABSTRACT OF THE DISCLOSURE

Certain oxide and nitride insulating materials are deposited on a substrate by a transport process using halogens or a hydrogen halide as the transport agent and having the substrate at a lower temperature than the source of the insulating material. Application of layers of such insulating materials to semiconductor devices is also described.

CROSS-REFERENCE TO RELATED APPLICATION

This application is a division of application Ser. No. 362,733, now abandoned, filed Apr. 27, 1964.

BACKGROUND OF THE INVENTION

This invention relates generally to methods for the formation of films or layers of insulating materials and particularly to such films employed for the purposes of protection or surface passivation of semiconductor devices.

*Description of the prior art*

The surface of a semiconductor device greatly affects the electrical characteristics of the device. Many techniques have been used and proposed to protect or passivate semiconductor surfaces and to modify the surface properties. It is still the case, however, that improvement in the effectiveness and dependability of semiconductor device surface treatments is desired.

Many materials that, by reason of their good dielectric properties, show promise as surface passivating layers on semiconductor devices have been unused for that purpose because of the lack of a suitable technique for forming a layer of the insulating material that is dense and adherent to the semiconductor device surface. The technique to be used must be one which requires only temperatures that are sufficiently low so as not to damage the semiconductor material and any chemicals used must be compatible with the semiconductor material.

Among the materials of interest are refractory oxides and nitrides of metals such as alumina, beryllia, titania, zirconia, aluminum nitride and silicon nitride. Some of these materials have been deposited by the known technique commonly referred to as vapor-plating using chemical reactions in a flow system. However, this process usually requires excessively high temperatures and is generally not successful for films at least as thick as a few microns. Therefore, it has not been applied to semiconductor devices.

There have been proposed in copending applications Ser. No. 340,529, filed Jan. 27, 1964, now Patent 3,287,-162, issued Nov. 22, 1966, by T. L. Chu and J. R. Gavaler and Ser. No. 360,266, filed Apr. 16, 1964, by T. L. Chu, both of which are assigned to the assignee of the present invention, novel techniques for the formation of layers of germania and silica on various substrates that are adherent and dense and may be grown to any desired thickness by a vapor transport technique. It is the case however that none of the materials referred to above may be formed by the techniques disclosed and claimed in the copending applications.

SUMMARY OF THE INVENTION

It is therefore an object of the present invention to provide improved methods for growing layers of materials of the group consisting of the oxides of aluminum, titanium, beryllium and zirconium and the nitrides of aluminum and silicon.

Another object is to provide a method for growing dense, adherent layers of the above referred to materials that requires only moderate temperatures and reactants not harmful to semiconductive materials.

Another object is to provide improved methods of forming layers of the above referred to materials so that such materials may be grown in layers of any desired thickness.

Another object is to provide improved semiconductor devices having a surface passivating layer of one of the above referred to materials.

It will be understood that while the present invention is described particularly in connection with the use of the techniques for growing films of insulating material as disclosed herein for the formation of passivating layers on semiconductor devices that other applications are possible. For example, among the possible applications are the use of such films as sheathing for solar cells, the formation of tunneling devices by the deposition of such a layer between metallic films, and the use of such films as dielectric layers in capacitors.

The invention, in brief, achieves the above mentioned and additional objects and advantages in a method that includes heating a quantity of the insulating material to be grown (from the group consisting of aluminum oxide, titanium oxide, beryllium oxide, zirconium oxide, aluminum nitride and silicon nitride) and a substrate in an atmosphere that includes either a halogen or hydrogen halide that reversibly reacts with the insulating material and providing a temperature gradient between the source of insulating material and the substrate such that the substrate is at a lower temperature than the source.

The invention also provides improved semiconductor devices comprising a body of semiconductive material with at least one p-n junction therein that terminates at a surface that has thereon a layer of one of the aforesaid insulating materials suitably formed in accordance with the above referred to method.

BRIEF DESCRIPTION OF THE DRAWING

The invention, together with the above mentioned and further objects and advantages thereof, will be better understood by reference to the following description together with the accompanying drawing wherein.

DESCRIPTION OF THE PREFERRED EMBODIMENTS

Figure 1:
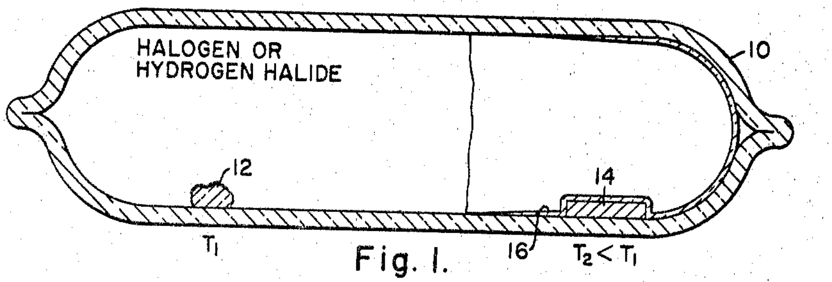
FIGURE 1 is a sectional view illustrating an arrangement suitable for use in the practice of the present invention.

The source of insulating material to be deposited may be any of the known forms for these materials such as powder or fused material. It is not necessary that the source of insulating material have any critical degree of purity. It is desirable that any impurities present be compatible with the vapor transport agent and not impede the transport of the insulating material. It is in fact the case that where nonreactive impurities are included within the insulating material, the resulting film grown by the method in accordance with this invention is of greater purity because of the lack of a transport mechanism for the impurities.

The substrates on which films of insulating material may be grown in accordance with this invention may be selected from those materials which at the temperatures at which the transport process is performed are compatible with the halogen or hydrogen atmosphere. Since the substrate in the practice of this invention never needs to exceed about 800° C., and may suitably be as low as about 350° C., possible substrates may be selected from a wide variety of semiconductors, metals and insulators. For the practice of the present invention to form an adherent and dense film of insulating material, the substrate need not have any particular degree of crystallinity.

The atmosphere should contain the halogen or hydrogen halide transport agent in a sufficient quantity to provide an adequate rate of reaction. The atmosphere can contain one or more of the halogens and hydrogen halides which react reversibly with the insulating material in question. Inert impurities present in the atmosphere will not prevent the reaction from going forward but will have a tendency to retard the rate of reaction. It is generally satisfactory to employ the gas transport agent in a partial pressure within the range of from about ½ atmosphere to about 10 atmospheres.

Within the chamber in which the source, substrate and transport agent are disposed, there must exist a temperature gradient between the source and substrate. The direction of transport in the temperature gradient depends on the variation of the equilibrium constant of the transport reaction with temperature. In all cases under consideration here, it is necessary that the source be at a higher temperature than the substrate for transport of the insulating material to occur. The temperature gradient can be provided by disposing the reaction chamber within a furnace having two independently controlled temperature zones. The difference in the magnitude of the temperatures of the source and substrate is not critical, however the reaction goes forward at a more rapid rate the greater the temperature gradient is. It is desirable to avoid high temperatures as much as possible. This requires selection of a temperature range for the material in question that provides a sufficient rate of action without causing additional problems. It has been found suitable for the deposition of layers of materials described herein to maintain the source at a temperature between about 700° C. and about 1200° C. and the substrate at a temperature of from about 350° C. to about 800° C.

The spacing between the source and substrate is selected so that an adequate temperature gradient can be provided in the furnace available and may suitably be in the range from about 3 inches to about 5 inches for available furnaces.

Following are indicated suitable transport agents and source and substrate temperatures that are preferred, but not absolutely necessary, for the deposition of various insulating materials in accordance with the present invention:

| Insulating Material | Transport Agents | Source Temperature (° C.) | Substrate Temperature (° C.) |
|---|---|---|---|
| $Al_2O_3$ | HCl or HBr | 800–1,000 | 400–700 |
| BeO | HCl or HBr | 900–1,200 | 500–700 |
| $TiO_2$ | HCl, HBr or $Cl_2$ | 800–1,000 | 500–700 |
| $ZrO_2$ | HCl or HBr | 1,000–1,200 | 600–800 |
| AlN | HCl, HBr, HI or $I_2$ | 800–1,100 | 500–800 |
| $Si_3N_4$ | HCl or HBr | 900–1,100 | 500–800 |

The reactions that occur between the insulating materials and the appropriate transport agents are as follows:

$$Al_2O_3+6HCl=2AlCl_3+3H_2O$$
$$Al_2O_3+6HBr=2AlBr_3+3H_2O$$
$$BeO+2HCl=BeCl_2+H_2O$$
$$BeO+2HBr=BeBr_2+H_2O$$
$$TiO_2+4HCl=TiCl_4+2H_2O$$
$$TiO_2+4HBr=TiBr_4+2H_2O$$
$$TiO_2+2Cl_2=TiCl_4+O_2$$
$$ZrO_2+2HCl=ZrCl_4+2H_2O$$
$$ZrO_2+2HBr=ZrB_4+2H_2O$$
$$2AlN+6HCl=2AlCl_3+N_2+3H_2$$
$$2AlN+6HBr=2AlBr_3+N_2+3H_2$$
$$2AlN+6HI=2AlI_3+N_2+3H_2$$
$$2AlN+3I_2=2AlI_3+N_2$$
$$Si_3N_4+12HCl=3SiCl_4+2N_2+6H_2$$
$$Si_3N_4+12HBr=3SiBr_4+2N_2+6H_2$$

Each of these reactions is reversible with the extent of reaction to the right decreasing with decreasing temperature. The reaction products on the right-hand side are gaseous at the temperatures employed and recombine at the cooler substrate to form a deposit of the insulating film. One or more of the above transport reactions can be carried out in the same reaction chamber.

There are two arrangements of apparatus in which the method in accordance with this invention may be performed. One involves a closed chamber containing the source, substrate and transport agent and the other uses an open chamber wherein the transport agent is continuously supplied and exhausted from the region in which the source and substrate are disposed.

FIG. 1 illustrates the practice of the invention in a closed chamber. The chamber may conveniently be a sealed off tube 10 of glass such as one of fused silica although other unreactive materials may be used. The source 12 and substrate 14 are placed in the tube 10. The tube 10 is then evacuated by a vacuum pump. Then a controlled quantity of the desired atmosphere is supplied and the tube sealed off. It is then inserted into a furnace (not shown) having two independently controlled temperature zones so that the source 12 is maintained at a temperature $T_1$ and the substrate 14 is maintained at a temperature $T_2$ that is less than $T_1$. Under these conditions the reactions before described are carried out and a film of the insulating material 16 is formed on the substrate 14. Since the wall of the tube in the vicinity of the substrate 14 is also a suitable substrate for the deposition of the insulating material, the film 16 will extend over the inside of the wall. However, this does not interfere with the formation of the insulating film 16 on the substrate 14 itself.

Figure 2:
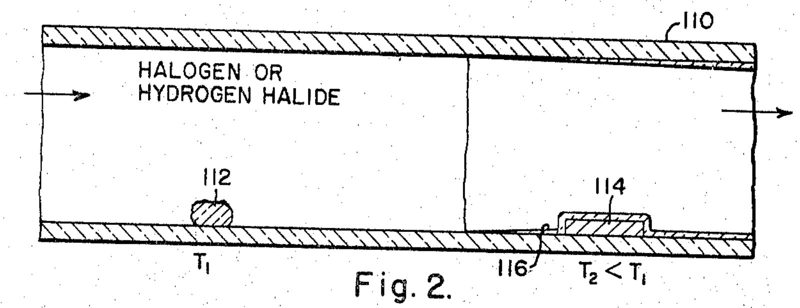
FIG. 2 is a sectional view of an alternative arrangement suitable for use in the practice of the present invention.

FIG. 2 shows the general configuration for utilizing the method in accordance with this invention in an open tube. The tube 110, which is of some unreactive material such as fused silica, has disposed therein a source 112 and a substrate 114 that are maintained by a furnace, not shown, with the source 112 at a temperature $T_1$ and the substrate 114 at a temperature $T_2$ less than $T_1$. Within the open end of the tubes adjacent the source 112 is supplied a transport agent. The reaction is carried out and a film of the insulating material 116 is formed over the substrate and the adjacent wall of the tube 110. The reformed transport agent is then exhausted from the end of the tube adjacent the substrate.

It is apparent that the practice of the invention with an open tube arrangement may be more convenient in instances in which a large number of substrates are to be coated and when it is desired to avoid the necessity of evacuation and seal off as is required with the closed tube arrangement.

Figure 3:
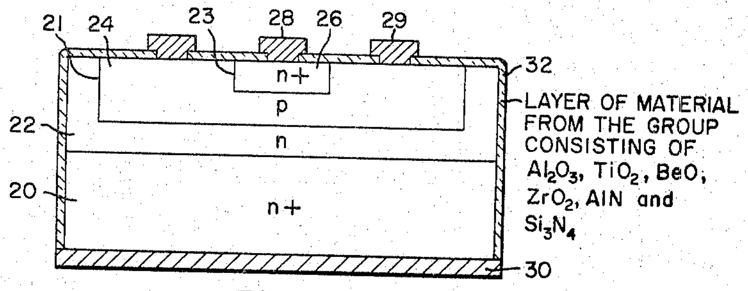
FIG. 3 is a sectional view of a semiconductor device in accordance with the present invention.

FIG. 3 illustrates a device in accordance with this invention. The illustrative device is of the type known as an epitaxial, double-diffused transistor. The structure comprises a substrate 20 of one type of semiconductivity with a fairly low resistivity, N+, having a layer 22 of the same type with a higher resistivity N, that may be formed by epitaxial growth, disposed thereon in monocrystalline relationship. In the surface of the N-type layer 22 are formed, a P-type region 24 and an N+ region 26 by two diffusion operations. The diffused regions form p-n junctions 21 and 23. The N+ region 26 and the P-type region 24 serve, respectively, as emitter and base regions of the transistor. The N+ substrate 20 and n-type layer 22 cooperate to provide the collector region. Contacts 28, 29 and 30 are disposed in ohmic contact with the emitter, base and collector regions, respectively.

Over the surface of the device is disposed a layer of material 32 from the group consisting of aluminum oxide, titanium oxide, beryllium oxide, zirconium oxide, aluminum nitride and silicon nitride that may be formed n accordance with the present invention. These insulating layers are adherent and pinhole free and hence provide advantages over passivating layers of conventionally formed silicon dioxide. The layer 32 may have a thickness of hundreds of microns and hence provide good protection for the p-n junctions 21 and 23 that terminate at the surface of the device.

It is within the scope of the proposed applications of this invention that a layer consisting of one or more of the group $Al_2O_3$, $TiO_2$, BeO, $ZrO_2$, AlN, and $Si_3N_4$ be deposited on the semiconductor substrate prior to formation of the p-n junctions by diffusion. The oxide or nitride coating would then serve the initial purpose of masking diffusion, except at places where windows had been formed in the coating such as by photoresist and etching techniques. After diffusion, the oxide or nitride coating would serve as a protective coating for the periphery of the p-n junctions.

Any one or more of the referred to insulating materials are particularly useful for surface passivation of semiconductor materials. In addition, other applications exist including providing a sheathing for solar cells. For such purpose a thick layer, such as about 1 millimeter, of insulating material would be grown on the solar cell surface for the purpose of shielding the solar cell from nuclear radiation without blocking solar radiation. Also, thin film tunneling devices and capacitors may be formed using a layer of insulating material formed in accordance with this invention between two metal films or between a body of semiconductive material and a metal film.

Following are described in greater detail examples of the practice of the present invention. Beryllium oxide was transported by the present method in a closed reaction tube of fused silica having an inner diameter of about 3.5 centimeters and length of 25 centimeters. The source was a beryllia pellet. The tube was attached to a vacuum manifold and evacuated to a vacuum of about $5\times10^{-6}$ Torr. Approximately $2.5\times10^{-3}$ moles (a pressure of about 2 atmospheres at the operating temperature) of hydrogen chloride was distilled into the reaction tube and the tube sealed off. This tube was placed in a two zone furnace, with the beryllia in one end of the tube maintained at about 1100° C. while the other end of the tube was maintained at about 650° C. Beryllia was transported to the cooler region of the tube and deposited thereon.

Using a similar arrangement as above-described, with a source of aluminum oxide in the form of alpha-alumina and an atmosphere of hydrogen chloride at a pressure of about 1 atmosphere with a source temperature of between about 800° C. and 900° C. and a temperature at the cool end of the tube of from about 400° C. and 500° C., the process was carried out with a resulting insulating film identified by X-ray techniques as gamma-alumina.

Also in a similar arrangement as above described silicon nitride was transported in accordance with this invention. The silicon nitride source was in the form of sintered pellets. The atmosphere was of hydrogen chloride of a pressure of between about 1 and 2 atmospheres. The source temperature was about 1000° C. and the temperature was about 500° C. at the cool end of the tube. A deposit of insulating material transported from the silicon nitride source was formed over the cool end of the tube.

It has been found possible in accordance with this invention to deposit insulating layers of any desired thickness, the growth apparently being linear with time.

While the present invention has been shown and described in a few forms only, it will be understood that various changes and modifications may be made without departing from the spirit and scope thereof.

We claim as our invention:

1. In a method of depositing an insulating material on a substrate, the steps comprising: heating a quantity of material of at least one member of the group consisting of aluminum oxide, titanium oxide, beryllium oxide, zirconium oxide, aluminum nitride and silicon nitride at a first temperature in an atmosphere containing at least one member of the group consisting of halogens and hydrogen halides that reversibly reacts with said material; heating a substrate at a second temperature less than said first temperature in said atmosphere to cause transport of said material to said substrate.

2. In a method in accordance with claim 1, the steps as set forth wherein said atmosphere contains at least one member of the group consisting of hydrogen chloride and hydrogen bromide when said material is at least one of the group consisting of aluminum oxide, beryllium oxide, zirconium oxide and silicon nitride; said atmosphere contains at least one member of the group consisting of hydrogen chloride, hydrogen bromide and chlorine when said material is of titanium oxide; and said atmosphere contains at least one member of the group consisting of hydrogen chloride, hydrogen bromide, hydrogen iodide and iodine when said material is of aluminum nitride.

3. In a method in accordance with claim 1, the steps as set forth wherein: said first temperature is in the range of from about 700° C. to about 1200° C. and said second temperature is in the range of from about 350° C. to about 800° C.

4. In a method in accordance with claim 1, the steps comprising: heating a quantity of aluminum oxide at a temperature of from about 800° C. to about 1000° C. in an atmosphere containing at least one member of the group consisting of hydrogen chloride and hydrogen bromide; and heating a substrate at a temperature of from about 400° C. to about 700° C. to cause vapor transport of aluminum oxide to said substrate.

5. In a method in accordance with claim 1, the steps comprising: heating a quantity of titanium oxide at a temperature of from about 800° C. to about 1000° C. in an atmosphere containing at least one member of the group consisting of hydrogen chloride, hydrogen bromide and chlorine; and heating a substrate at a temperature of from about 500° C. to about 700° C. to cause vapor transport of titanium oxide to said substrate.

6. In a method in accordance with claim 1, the steps comprising: heating a quantity of beryllium oxide at a temperature of from about 900° C. to about 1200° C. in an atmosphere containing at least one member of the group consisting of hydrogen chloride and hydrogen bromide; and heating a substrate at a temperature of from about 500° C. to about 700° C. to cause vapor transport of beryllium oxide to said substrate.

7. In a method in accordance with claim 1, the steps comprising: heating a quantity of zirconium oxide at a temperature of from about 1000° C. to about 1200° C. in an atmosphere containing at least one member of the group consisting of hydrogen chloride and hydrogen bromide; and heating a substrate at a temperature of from about 600° C. to about 800° C. to cause vapor transport of zirconium oxide to said substrate.

8. In a method in accordance with claim 1, the steps comprising: heating a quantity of aluminum nitride at a temperature of from about 800° C. to 1100° C. in an atmosphere containing at least one member of the group consisting of hydrogen chloride, hydrogen bromide, hydrogen iodide and iodine; and heating a substrate at a temperature of from about 500° C. to 800° C., lower than the temperature of said quantity of aluminum nitride, to cause vapor transport of aluminum nitride to said substrate.

9. In a method in accordance with claim 1, the steps comprising: heating a quantity of a silicon nitride at a temperature of from about 900° C. to about 1100° C. in an atmosphere containing at least one member of the group consisting of hydrogen chloride and hydrogen bromide; and heating a substrate at a temperature of from about 500° C. to about 800° C. to cause vapor transport of silicon nitride to said substrate.

References Cited

Schafer et al., Z. Anorg. Y. Allgem. Chem., vol. 286, p. 27 (1956).

ALFRED L. LEAVITT, *Primary Examiner.*

A. GOLIAN, *Assistant Examiner.*